United States Patent
Hoffmann

(10) Patent No.: US 7,436,900 B2
(45) Date of Patent: Oct. 14, 2008

(54) INTERMODULATION DISTORTION IDENTIFICATION AND QUANTIZATION CIRCUIT FOR A LINEAR AMPLIFIER SYSTEM

(75) Inventor: Shlomo Hoffmann, Randolph, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 1637 days.

(21) Appl. No.: 09/820,146

(22) Filed: Mar. 28, 2001

(65) Prior Publication Data

US 2002/0141509 A1    Oct. 3, 2002

(51) Int. Cl.
*H04L 25/03* (2006.01)

(52) U.S. Cl. .................. 375/296; 375/285; 375/297; 330/52; 330/149

(58) Field of Classification Search .............. 375/278, 375/284, 285, 295, 296, 297; 330/52, 149, 330/151; 455/63
See application file for complete search history.

(56) References Cited

U.S. PATENT DOCUMENTS

| | | | |
|---|---|---|---|
| 5,115,202 A | 5/1992 | Brown | 330/9 |
| 5,528,196 A | 6/1996 | Baskin et al. | 330/151 |
| 5,877,653 A | 3/1999 | Kim et al. | 330/149 |
| 5,912,586 A * | 6/1999 | Mitzlaff | 330/149 |
| 5,937,011 A * | 8/1999 | Carney et al. | 375/297 |
| 5,969,572 A | 10/1999 | Jeong et al. | 330/149 |
| 6,157,254 A * | 12/2000 | Myer | 330/52 |
| 6,259,319 B1 * | 7/2001 | Ghanadan et al. | 330/149 |
| 6,525,603 B1 * | 2/2003 | Morgan | 330/52 |
| 6,829,471 B2 * | 12/2004 | White et al. | 455/194.2 |

* cited by examiner

*Primary Examiner*—Dac V Ha

(57) ABSTRACT

A method and multiple carrier linear amplifier circuit reduces intermodulation distortion by sampling the multiple carrier linear amplifier radio frequency signal and detecting the sampled signal at frequency increments and quantizing and nulling the intermodulation distortion. The signal can have predetermined frequency increments $f_o \ldots f_i$ situated in at least one of predetermined sub-bands. The sampled radio frequency signal can be mixed with the local oscillator signal to target the centers of the multiple carriers and generate an intermediate frequency signal.

22 Claims, 7 Drawing Sheets

INTERMODULATION DISTORTION IDENTIFICATION AND QUANTIZATION CIRCUIT FOR A LINEAR AMPLIFIER SYSTEM

FIELD OF THE INVENTION

This invention relates to the field of linear amplifiers, and more particularly, this invention relates to a method and circuit for canceling intermodulation distortion in multiple carrier linear amplifiers.

BACKGROUND OF THE INVENTION

Radio frequency amplifiers use linear amplifiers that are not always "clean," and in operation, often produce intermodulation distortion. This distortion creates interference at the operating frequencies used by radio frequency, cellular, and other similar communications circuits. As cellular and other communication systems become more important and prevalent, it is necessary to reduce the intermodulation distortion produced in amplifier systems, and especially linear power amplifiers, which play an important part in these systems.

Some prior art techniques suppress intermodulation distortion by generating an inverse distortion signal and applying it to the input end of the amplifier. Another prior art technique uses a negative feedback system for negatively feeding back the distortion signals with an output signal at its input end. Other prior art techniques use a feed forward system that extracts the intermodulation distortion signals, and inverts the phase of those signals to cancel the problematic signals. This type of system is widely used in base stations, satellites, and mobile communication systems. This system has high efficiency in suppressing the signals as compared to other types of linear power amplifiers, but is typically complex in structure and large. Sometimes the circuits cause increased power losses. Decreasing intermodulation distortion becomes even more important in multiple carrier linear amplifiers that are operative with multiple carriers in communications systems. Even small amounts of intermodulation distortion can create extreme performance problems.

SUMMARY OF THE INVENTION

A method of the present invention is associated with a multiple carrier linear amplifier circuit and reduces intermodulation distortion by sampling the output of the multiple carrier linear amplifier radio frequency signal and detecting the sampled signal at frequency increments and quantizing and nulling the intermodulation distortion. The circuit can generate a local oscillator signal having predetermined frequency increments $F_o \ldots F_i$ situated in at least one of predetermined sub-bands. The sampled radio frequency signal is mixed with the local oscillator signal to target the centers of the multiple carriers and generate an intermediate frequency signal. This signal is detected and digitized for quantization and nulling of the intermodulation distortion.

The method can also include the step of filtering the resultant intermediate frequency signal before detecting and digitizing for quantization. The circuit is stepped for the local oscillator frequency increments $F_o \ldots F_i$ and the outputs of the stepping operation are compared to identify sub-bands. The circuit identifies which frequencies are active in which sub-bands, and adjusts the local oscillator frequency based on determined active frequencies. The generated frequency increments $F_0 \ldots F_{11}$ can be incremented in five MHz increments. The radio frequency signal can be generated in the radio frequency range from about 2110 to about 2170 MHz. The radio frequency signal can be divided into three sub-bands, each sub-band having up to four carriers. The intermediate frequency signal can be detected within a sample and hold circuit having a detector operative therewith.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
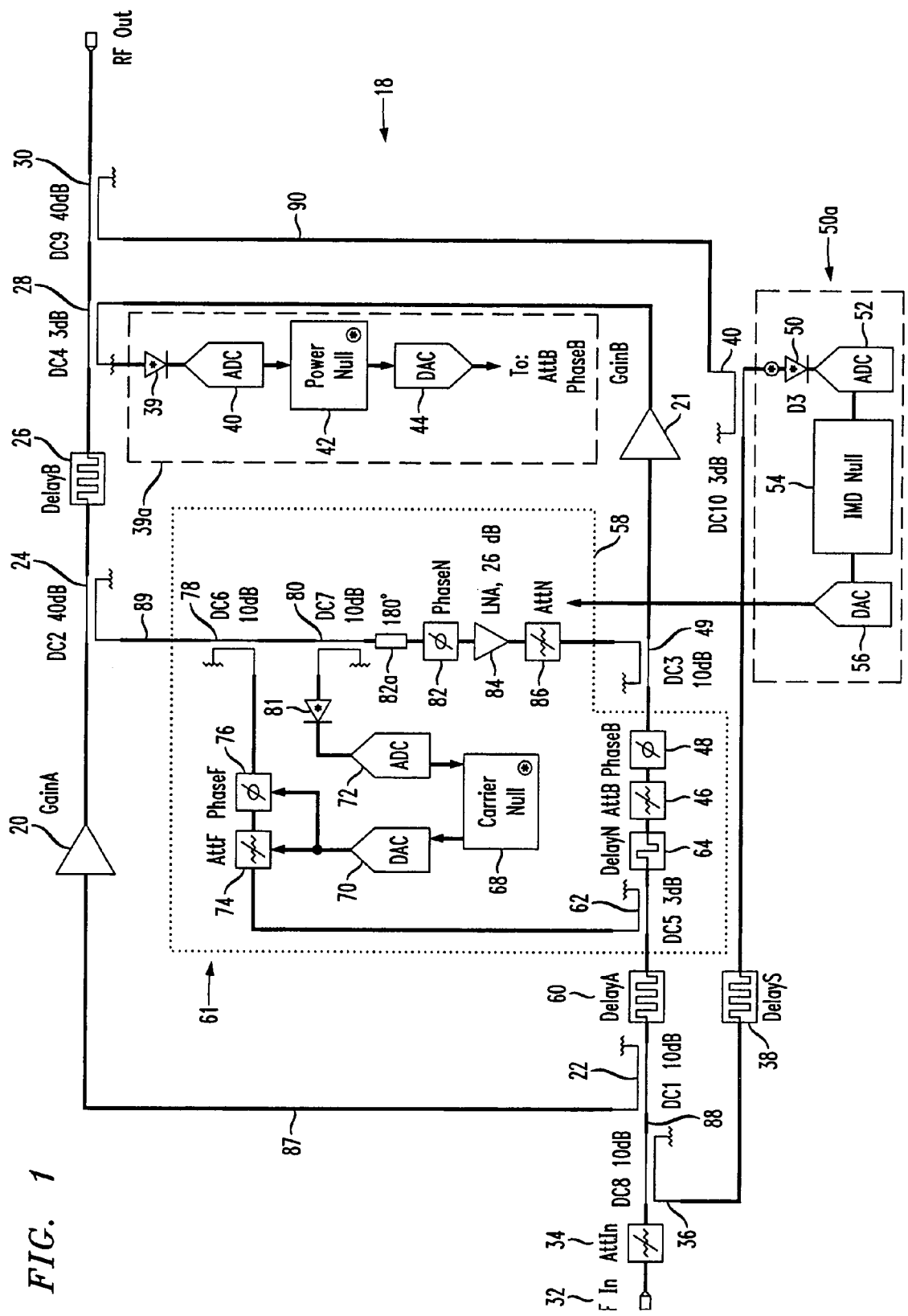
FIG. 1 is a circuit of an intermodulation distortion nulling circuit that isolates amplifier output by subtracting the clean signal from the distorted output signal while using a large delay line.

FIG. 1 illustrates a first intermodulation distortion nulling circuit 18 as part of a multiple carrier linear amplifier (MCLA) that isolates the amplifier output intermodulation distortion and subtracts the clean input signal from the distorted output signal, thus retrieving the intermodulation distortion products. For purposes of description, the general connections among components is first described, followed by a brief working of the circuit. Further details of this type of circuit are described in U.S. patent application Ser. No. 09/564,321 filed May 3, 2000, as docket number Hoffmann 2, the disclosure which is hereby incorporated by reference in its entirety.

The circuit works with a carrier cancellation loop. The circuit shown in FIG. 1 uses a large delay line, DelayS, to achieve linear operation across a wide frequency band application. This delay line significantly increases the weight and cost of a multi-channel, i.e., multiple carrier, linear amplifier. In this circuit, gain A and gain B amplifiers are balanced amplifiers. An output is sampled and the signal injected as inputs to gain A and gain B amplifiers. There are two illustrated delays in the circuit shown in FIG. 1, delay N and delay B. Because the amplifiers are wideband, any delay compensates for the amplifiers. If the amplifiers are identical, then the delays are identical.

For purposes of the description of FIG. 1, the interconnection among various circuit components are described, followed by their function. Gain A amplifier 20 and Gain B amplifier 21 are balanced amplifiers. Gain A amplifier 20 connects to couplers DC1 22 and DC2 24 and to delay B circuit 26, which series connects to couplers DC4 28 and DC9 30. A radio frequency signal 32 enters through an attenuator 34 into the coupler DC8 36 and into coupler DC1 22. The delay line, DelayS 38, is coupled from coupler DC8 36 and connects to coupler DC10 40. From coupler DC1 22, the signal passes to the gain A amplifier 20 into coupler DC2 24, as noted before. Series connected from the coupler DC4 28 is the signal combination control circuitry 39a, including diode detector 39, analog-to-digital converter 40, the power null circuit 42, and the digital-to-analog converter 44, which then passes signals to the AttB circuit 46, the Phase B circuit 48, coupler DC3 49 and Gain B amplifier circuit 21. Coupler DC10 40 also receives input signals via a delay line connected to coupler DC8 36, and coupler DC10 40. The signal passes from DC10 40 as a detected signal into the distortion cancellation control circuitry 50a having a diode D3 50, analog-to-digital converter 52, intermodulation distortion null circuit 54, (IMD null), the digital-to-analog converter 56 and into the multiple carrier linear amplifier circuit segment shown generally by dotted line 58.

The coupler DC1 22 is connected into the delay A circuit 60 and into adjustment circuit 61. In this embodiment, the adjustment circuit is an independent adjustment circuit 61 where phase and/or amplified signal components are independent. In other embodiments, the phase and/or amplified signal components can be adjusted together. Thus, the invention can be accomplished independent or dependent (together). The circuit 61 includes coupler DC5 62, Delay N circuit 64, AttB circuit 46 and Phase delay B circuit 48, in series. The carrier null circuit 68, as illustrated, includes a digital-to-analog converter circuit 70 and an analog-to-digital converter circuit 72 with DAC 70 connected to AttF circuit 74 and Phase F circuit 76, coupling to DC5 62 and coupler DC6 78, which, in turn, connects to coupler DC2 24. Coupler DC7 80 is ADC 72 connected and also connects to coupler DC6 78, diode 81, and to 180 degree phase delay 82a and phase shifter N circuit 82, and series connected linear noise amplifier 84, and AttN circuit 86 and DC3.

It should also be understood that the entire carrier cancellation line shown at 62, 74, 76 can be eliminated. The carrier and distortion would be adjusted at the coupler 89. It is then possible to have an adjuster as the coupler at 89, which adjusts the phase and/or gain on both, i.e., the carrier and distortion. Thus, it is possible that the circuit could be used in other locations to detect other circuit functions, for example, to detect the carrier signal and the active sub-bands at the carrier null circuit 68.

FIG. 1 shows the general block diagram of the amplifier architecture or system 18, and includes a first amplifier path 87 and a second amplifier path 88 carrying replicas of signal components. On the first amplifier path 87, the first amplifier 20 amplifies signal components and generates distortion components. A replica of the amplified signal components and distortion is provided to a coupling path 89. The adjustment circuit 61 receives the distortion components from the coupling path 89 and the signal components from the second path 88 to independently adjust the phase and/or gain of at least one of the signal components and the distortion components, which adjusts the gain and/or phase relationship between the signal components and the distortion components. In this embodiment, the adjustment circuit 61 isolates the distortion components on the coupling path by combining signal components from the second path 88 and the signal components on the coupling path 89, which are about 180 degrees out of phase and substantially equal in amplitude and thus canceled. The distortion components are amplitude and/or phase adjusted by the phase shifter 82 and the attenuator 86. Because the signal components have been substantially removed from the coupling path, the phase and/or gain adjustments to the distortion components are made without a corresponding adjustment to the phase and/or amplitude of the signal components.

The adjusted distortion components are coupled onto the second path where the signal components and the adjusted distortion components are amplified by the second amplifier 21. The amplified signal components and distortion components on the second path 88 are combined with the amplified signal components and distortion components on the first path 87 to combine constructively the signal components and destructively combine the distortion components. In the embodiment of FIG. 1, using the illustrated independent adjustment circuit (although the circuit does not have to be independently adjusted), when the distortion components are adjusted relative to the signal components, the phase and/or gain relationship between the signal components and the distortion components becomes independent. Thus, phase and/or gain adjustments to the distortion and signal components can be made, which improve both the constructive combination of the signal components and the destructive combination of the distortion components.

In operation, the amplifier system 18, the coupler 36, such as a 10 dB coupler (DC 8), receives the signal RFin and couples replicas of the signal Rfin 32 onto the first amplifier path 87 and the second amplifier path 88 after an initial amplitude adjustment of RFin by the attenuator (AttIn) 34. The coupler provides the signal components on the first path 87 with 0 degrees phase shift and 10 dB of attenuation. The signal components are provided to the second path 88 with little attenuation and 90 degree of phase shift delay. The amplifier 20 amplifies the signal components on the first path by Gain A to produce the amplified signal components along with distortion components generated by the amplifier with 0 degrees of relative phase shift. The coupler 24, such as a 40 dB directional coupler, couples the signal components and the distortion components onto the first path 88 and the coupling path 89. Using a 40 dB coupler, the signal components and the distortion components are coupled onto the coupling path with 40 dB of attenuation with no phase shift. The signal components and the distortion components remaining on the first path are delayed by a phase shift of 90 degrees with little attenuation to a phase value of −90 degrees. Further details of this type of circuit operation can be found in the incorporated by reference Hoffmann 2 patent application, U.S. patent application Ser. No. 09/564,321.

Distortion components isolated on the coupling path 89 are provided to a 180 degree phase delay 82a, giving the distortion components on the coupling path a phase value of 0 degrees (−180−180=−360=0 degrees). The phase shifter 82 provides a phase adjustment to the distortion components, which is not provided to the signal components which have been substantially canceled, reduced or removed from the coupling path 89. In this embodiment, the amplifier 84, such as a low noise amplifier, amplifies the distortion components on the coupling path 89 by 26 dB. The attenuator 86 provides an amplitude adjustment to the distortion components which is not provided to the signal components which have been removed from the coupling path 89. As such, the distortion components are phase and/or amplitude-adjusted independent of the signal components which have been substantially canceled, reduced or removed from the coupling path prior to the distortion components being combined with signal components on the second path 88. By independently phase and/or amplitude adjusting the distortion components on the coupling path 89, the destructive combination of the corresponding distortion components at the output of the amplifier architecture 18 can be independently controlled and improved.

In this circuit, in addition to making the relative gain and/or phase adjustments between the distortion components independent of the relative phase and/or gain adjustments to the signal components, the signal components on the first path 87 become independent of the signal components on the second path 88.

In other configurations where the power of the signal components is distributed among first and second amplifier paths, equal power at the inputs to first and second amplifiers on the separate paths can be achieved by sampling the output of the first amplifier, rotating the phase of the sample, and attenuatively adding the sample to the signal components on the second path to reduce the level of the signal components through what can be referred to as vector attenuation. As such, the signal components input to the second amplifier are dependent upon the output to the first amplifier.

The system 13 also distributes the power of the input signal components on the first and second amplifier paths 87,88, thereby enabling improved power efficiency. In this circuit, however, the signal components on the first path 87 are independent from the signal components on the second path 88, for example, by passively coupling and attenuating the signal components on the second path without vector attenuation. Because the signal components are removed from the coupling path 89, the signal components on the second path 88 provided to the second amplifier 21 (GainB) are independent of the signal components output from the amplifier 20 (GainA) on the first path 87, in that the amplified signal components from the first amplifier 20 will not affect the signal components on the second path 88. Additionally, the loss of the first amplifier 20 (GainA) will not result in an undesired large increase in power level at the combined output of the system 18. Instead, about one half of the power of the signal components would be produced.

The adjusted distortion components on the coupling path 89 are provided to the coupler 49, such as a 10 dB directional coupler, which attenuates the distortion components on the coupling path 89 by about 10 dB and combines the distortion components from the coupling path with the signal components on the second path 88. Before being provided to the coupler 49, the signal components from the coupler are delayed by the delay 64 (DelayN) by an amount such that the distortion components on the coupling path arrive at the coupler at substantially the same time as the signal components corresponding to the distortion components. The signal components corresponding to the distortion components are the signal components which resulted in the distortion components when the signal components were amplified. The attenuator 46 adjusts the amplitude of the signal components on the second path 88. A phase delay 48, such as a 90 degree phase delay, delays the signal components on the second path 88 by 90 degrees to have a phase value of −90 degrees. The attenuator 46 and the phase delay 48 provide gain and phase adjustments to the signal components on the second path 88 without a corresponding change to the distortion components and thereby could be considered as part of an independent adjustment arrangement. The delay 64, the attenuator 46 and the phase delay 48 provide constant time, amplitude and phase adjustments to enable the different paths carrying components to be combined to match up in terms of time, gain and phase for improved combining given the components used in this embodiment.

The signal components on the second path 88 at −90 degrees and the adjusted distortion components on the coupling path 89 at 0 degrees are provided to the coupler 49. In this embodiment, the coupler 49 phase shifts the signal components on the second path 88 by 90 degrees to about −180 degrees and combines the signal components with the distortion components from the coupling path at about 0 degrees onto the second path. As such, the signal components with phase values at about −180 degrees and the distortion components with phase values at about 0 degrees are provided onto the second path in this embodiment. However, the 180 degree out of phase relationship and/or the amplitude difference between the signal components and the distortion components on the second path 88 can be changed due to the independent adjusting of the phase and/or amplitude of the distortion components on the coupling path 89.

An attenuator 46 could adjust amplitude and the phase shifter 48 could shift the phase of the signal and distortion components. The signal and distortion components are amplified by the amplifier 21, and the amplified signal and distortion components are combined at the coupler 30, such as a 3 dB coupler, with the corresponding signal and distortion components on the first path 87. The amplifier 21 amplifies the distortion components received from the second path 88 at about 0 degrees and generates distortion components at about −180 degrees from amplifying the signal components from the second path 88 which are at −180 degrees. In this circuit, the sampled distortion components from the amplifier 20 amplified by the amplifier 21 at about 0 degrees are reduced by the distortion components generated at the amplifier 21 at about −180 degrees from amplifying the signal components at −180 degrees, leaving distortion components at about zero degrees.

In this circuit, the signal components at the input to the amplifier 21 should have the same amplitude as the signal components at the amplifier 20 with a phase value of −180 degrees. The signal and distortion components from the coupler 28 at phase values of −90 degrees are provided to the delay 26 (DelayB) which delays the signal components and the distortion components on the first path 87 such that the corresponding portions of the signal and distortion components on the first path 87 and the signal and distortion components on the second path 88 reach the coupler 30 at substantially the same time. The amplified signal and distortion components on the first path 87 are received by the coupler 30, which delays the signal and distortion components by 90 degrees to phase values of about −180 degrees. In producing the amplified signal components RFout, the coupler 30 constructively combines the signal components from the first and second paths 87,88 in phase and at about the same amplitude such that the first and second paths each provide one-half of the power to the signal components at the output of the system. Since the distortion components on the first and second paths 87,88 are at about 180 degrees out of phase, the distortion components on the first path destructively combine with the distortion components on the second path to reduce the distortion components at the output of the coupler 30.

As noted before, the independent adjustment circuit 61 enables the relative phase and/or gain between the distortion components on the first and second paths 87,88 to be adjusted independent of the relative phase and/or gain adjustments between the signal components on the first and second paths. It should be understood, however, as noted before, that the adjustment circuit 61 does not have to be independent but the phase and/or amplified signal components can be adjusted together. As such, the destructive combining of the distortion components from the first and second paths at the coupler 28 can be improved by performing adjustments to the relative phase and/or gain of the distortion component on the coupling path. The power amplifier system can also provide adjustable phase and/or amplitude adjustments to the signal components which do not result in a corresponding phase and/or amplitude adjustments to the distortion components to provide adjustment of the signal components.

The adjustment of the relative gain and/or phase of the distortion components and/or the signal components can be performed once to align the power amplifier architecture on the production line, periodically (based on changing conditions or expiration of a time period), or dynamically (based on changing operating conditions or continuously). Because the constructive combination of the signal components can be made independent of the destructive combination of the distortion components, dynamic control to further improve the operation of the architecture can be provided in a relatively simple manner.

Coupler 78 can be used in conjunction with phase shifter 76 and attenuator 78 to improve cancellation of signal components. Dynamic control can also be provided by use of carrier null circuit 68 and DAC circuit 70 and ADC circuit 72, which work in conjunction with diode detector 81 and coupler 80. The carrier null circuit 68 acts as a power detector with the diode detector 81 to provide a power signal, indicating how well the cancellation of the signal components have been achieved.

Control circuitry can monitor the signal cancellation signal and provide control signals to the digital to analog (D/A) converter 70 to adjust the gain and/or phase provided by the gain 72 and phase adjusters 74 in response to the signal cancellation signal. The control circuitry provides the control signals to find the gain and/or phase adjustments, which produce a null in the cancellation signal and reflects good cancellation of the signal components on the coupling path 89. This control can be set during initial alignment, or dynamic control provided. Dynamic control is provided because during operation any changes in the signal cancellation signal indicating a degradation in the cancellation of the signal components on the coupling path 89 can be responded to with a control signal to adjust the gain and/or phase to improve cancellation of the signal components.

By achieving improved cancellation of the signal components on the coupling path, the distortion components can be isolated on the coupling path, and the distortion components can be independently adjusted to improve the cancellation of the distortion components at the output of the coupler 28. By providing for adjustment of the distortion components, control of the combination of the distortion components is possible, and dynamic control of the cancellation of the distortion components can be readily achieved, which in the presently illustrated circuit, are independently controlled.

A coupler 30 couples a replica of the output signal RFout onto a distortion cancellation path 90 and provides the signal to distortion cancellation control circuitry 50a, which provides gain and/or phase adjustment control signals to gain and/or phase adjusters 82,86 in response to the coupled output signal. A signal on the distortion cancellation path 90 is provided to the coupler 40, which combines the signal on the signal cancellation path with a delayed version of the signal components coupled from the coupler 36 at the input of the architecture. The signal components from the coupler 36 are delayed such that the corresponding portions of the signal components arrive at the coupler 40 at substantially the same time. The corresponding signal components should be about 180 degrees out of phase such that the signal components are reduced and the distortion components from the signal on the distortion cancellation path can be detected by detection circuitry 50, for example including a diode detector.

The detection circuitry 50 provides a distortion cancellation signal indicating the level of the distortion components remaining on the output of the coupler 28, thereby indicating the level of the cancellation of the distortion components at the coupler 28. The distortion cancellation signal is provided to an A/D converter 52, which digitizes the distortion cancellation signal. The digitized distortion cancellation signal is provided to control circuitry 54. The control circuitry 54 monitors the distortion cancellation signal and provides control signals to a digital to analog (D/A) converter 56 to adjust the gain and/or phase provided by the gain and phase adjusters in response to the distortion cancellation signal.

The control circuitry 54 provides the control signals to find the gain and/or phase adjustments which produce a null in the distortion cancellation signal which reflects good cancellation of the distortion components at the coupler 28. This control can be set during initial alignment, or dynamic control provided. Dynamic control can be provided because, during operation, any changes in the distortion cancellation signal indicating a degradation in the cancellation of the distortion components at the coupler can be responded to with control signals to adjust the gain and/or phase to improve cancellation of the distortion components.

By providing for the adjustment of the distortion components, control over the constructive combination of the signal components at the coupler 28 is possible whereby gain and/or phase adjustments are made to the signal components (alone or together with the distortion components depending on the embodiment) depending on how the constructive combination of the signal components is performed. Dynamic control of the constructive combination of the signal components can be readily achieved. In this embodiment, a signal combination signal indicative of how well the signal components are combining in the coupler 28, for example a signal on the isolated port of the coupler, is provided to signal combination control circuitry which provides gain and/or phase adjustment control signals to gain and/or phase adjusters 46,48 in response to the signal combination signal.

The signal combination control circuitry includes the detection circuitry 39, for example including a diode detector, which detects the signal combination signal and provides a combination signal indicating how well the signal components combined in the coupler 28. The combination signal is provided to an A/D converter 40, which digitizes the combination signal, and the digitized combination signal is provided to the power null, control circuitry 42. The control circuitry 42 monitors the combination signal and provides control signals to a digital to analog (D/A) converter 44 to adjust the gain and/or phase provided by any gain and phase adjusters 46,48 in response to the signal combination signal. The control circuitry 50a provides the control signals to find the gain and/or phase adjustments which produce a null in the combination signal which reflects good constructive combination of the signal components at the coupler. This control can be set during initial alignment, or dynamic control provided. Dynamic control is provided because, during operation, any changes in the signal combination signal indicating a degradation in the combination of the signal components at the coupler can be responded to with control signals to adjust the gain and/or phase to improve constructive combination of the signal components.

In operation, it is evident that a signal is sampled and the main signal is cancelled because the coupler DC5 62 samples the input and rotates it 180°. This circuit cancels from the sample and from the amplifier. What is left is the intermodulation distortion, and it is phase shifted, attenuated, and injected into the path of the other circuit signal into the gain B amplifier 21, which amplifies the distortion. The input power to gain B amplifier 21 is equal to the input power to gain A amplifier 20, under most conditions. Because the gain B amplifier amplifies power as gain A, distortion will also be generated and combined with the amplified distortion.

As a result, the signal is combined with a resultant, which will be equal in amplitude to the original distortion from the gain A amplifier, but 180° out of phase. When both distortions are added at coupler DC4 28, the distortions cancel each other. As will be suggested to those skilled in the art, there is a question about the distortion left at the output for coupler DC9 30, which samples a combined total output signal and transfers the signal to coupler DC10 40. At the same time, the circuit samples the input from coupler DC8 36 via the DelayS line 38, which is applied to the other side of coupler DC10 40. Both signals will be equal in amplitude and 180° out of phase and will cancel each other.

What will be cancelled will be the main signal, while at the inputs, there is no distortion. What will be left after cancellation is the distortion product. Whatever power is left, the circuit will detect and digitize and send into the null circuit, which will provide adjustment as a closed loop until the null is minimized.

In order for this illustrated circuit to work properly, a large delay line is required, as shown with the line having DelayS 38. The entire circuit is delayed. It is not desirable to have two different phase slopes, and thus, the delay is designed into the circuit with DelayS line 38. If there were two different phase slopes, then it would be necessary to cancel at coupler DC3. If there is no cancellation, then there would be a false indication of intermodulation distortion and the circuit would not be aligned properly. It is known to those skilled in the art, however, if the delay is large, it is costly to design the circuit, and the circuit will be physically large. If the amplifier in this circuit is used in a wideband configuration, such as with four different 20 MHz CDMA carriers in side-by-side relation, there will not be adequate cancellation.

Figure 2:
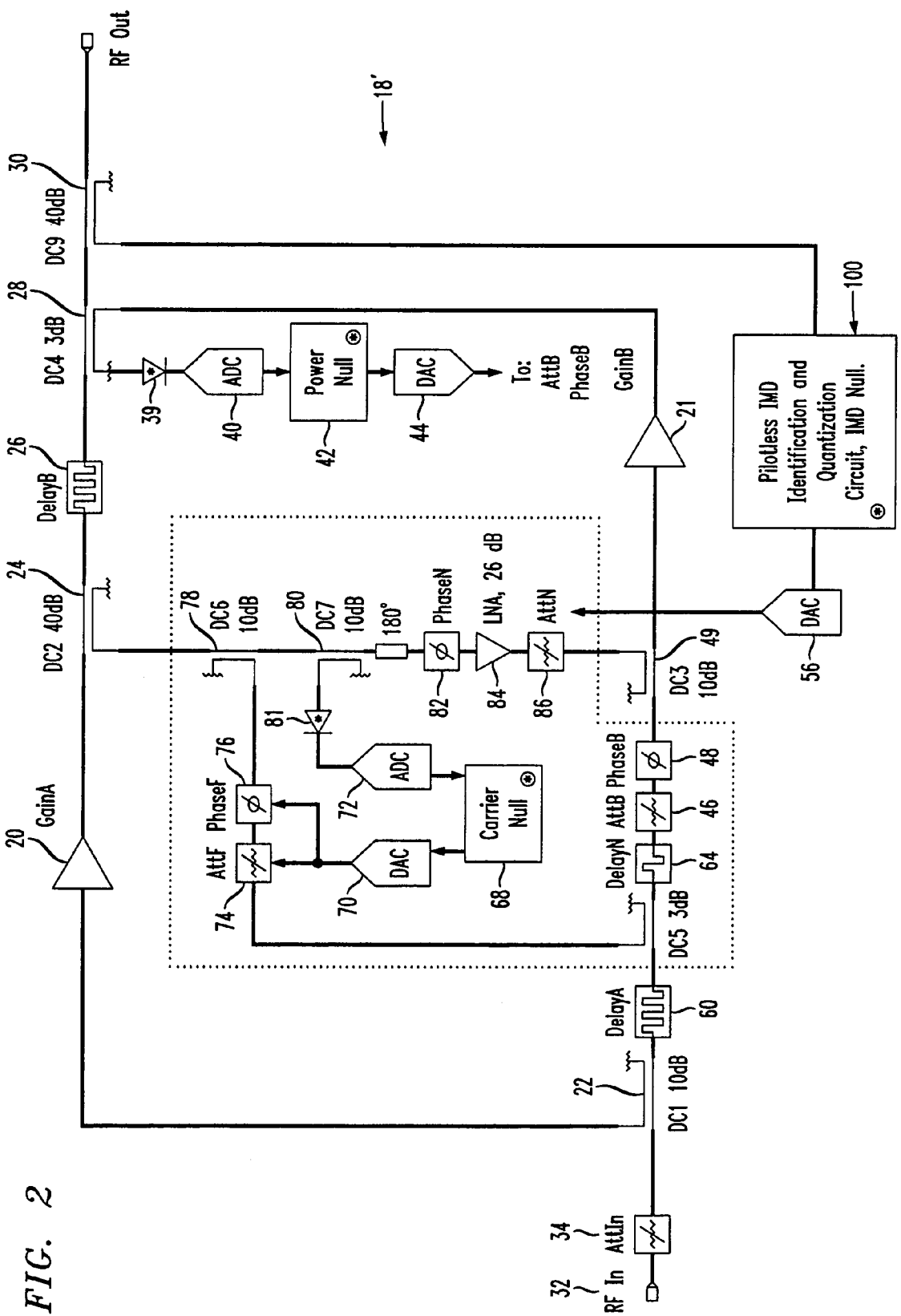
FIG. 2 is an alternate and improved intermodulation distortion nulling circuit of the present invention where the output of the amplifier system is used to extract the required intermodulation distortion information.

FIG. 2 illustrates the improved circuit of the present invention using a pilotless intermodulation and quantization circuit 100 (IMD nullification circuit). In this circuit, no indication is taken from the inputs. Only the outputs are used and no delay line is necessary. The circuit of FIG. 2 is similar in structure and function to what is shown in FIG. 1, with the exception of the added quantization circuit 100 of the present invention.

Figure 3:
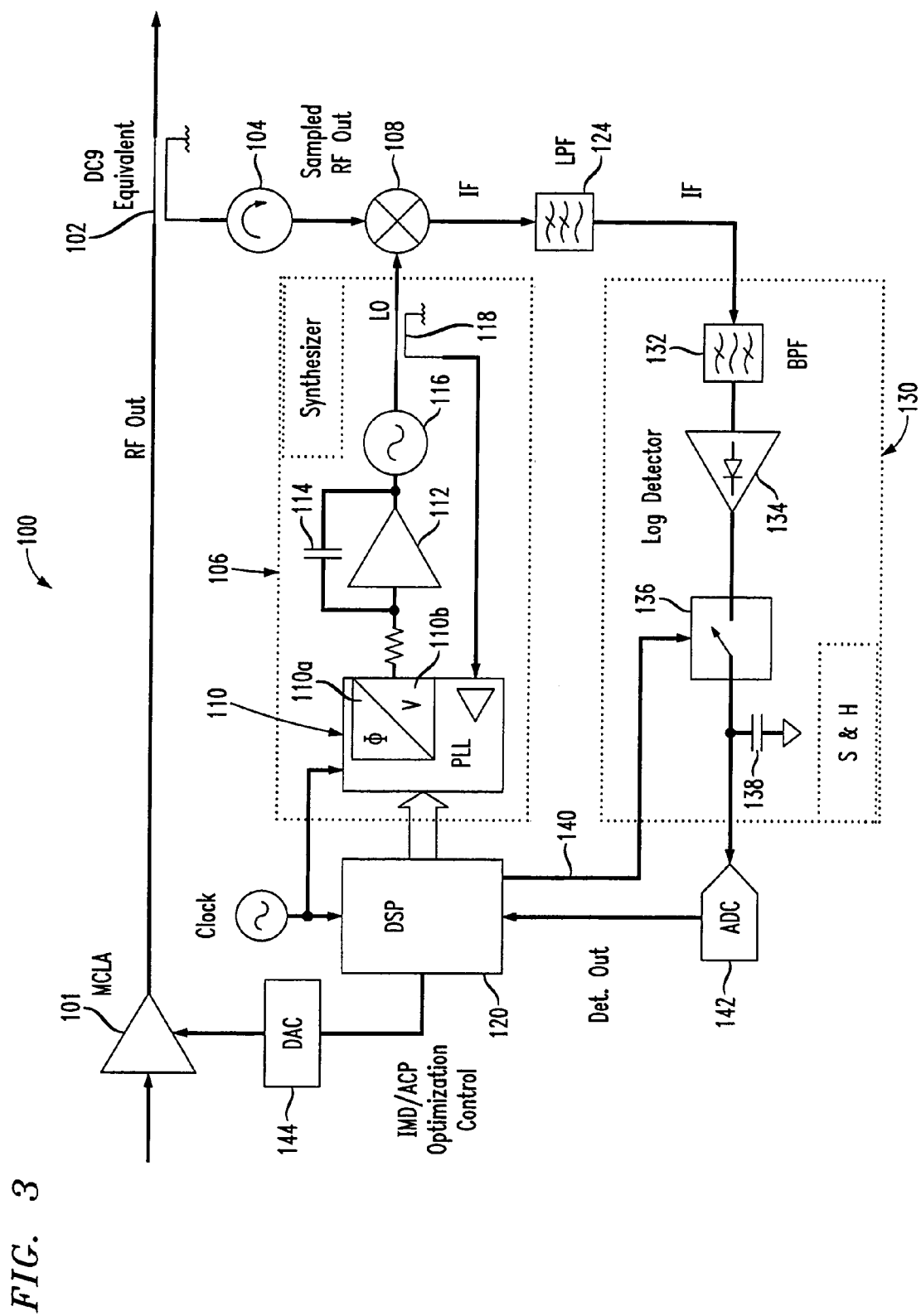
FIG. 3 is a circuit diagram of the intermodulation distortion identification and quantization circuit shown in FIG. 2.

FIG. 3 is an enlarged schematic circuit diagram of the pilotless intermodulation distortion identification and quantization circuit 100 shown in FIG. 2. In this description, like elements from FIGS. 1 and 2 are described with common reference numerals.

In this circuit, there is a simulation of the multiple carrier linear amplifier circuit 101, where the power comes in/out, and the drive passes into the multiple carrier linear amplifier circuit. The control voltage is the same as in FIG. 2, and the upper coupler 102 is an equivalent for the coupler DC9, shown in FIG. 2.

Extending from the DC9 coupler equivalent 102 is an isolator 104, which could be an optional circuit component. A synthesizer circuit 106 is coupled into a heterodyned mixer circuit 108, which is series connected to the isolator 104 and DC9 equivalent 102. The synthesizer circuit 106 ensures that no leakage occurs back into the output of the amplifier system. The isolator 104 allows the power to drop, and it blocks those signals that would be prone to pass back into the sample circuit corresponding to the DC9 equivalent 102. The mixer circuit 108 functions similar to a small receiver.

The synthesizer circuit 106 includes a phase lock loop circuit 110 with phase 110a and voltage 110b circuit components, and a loop filter corresponding to the operational amplifier 112 with the capacitive feedback using capacitor 114. The phase lock loop circuit 110 connects to an oscillator circuit 116 and coupler circuit 118 with feedback from the coupler circuit 118 for closed loop operation. A digital signal processor (DSP) circuit 120 connects to phase lock loop circuit 110 and allows intermodulation distortion and adjacent channel power (IMD/ACP) optimization control.

This DSP circuit 120 is a generic circuit and could be a microprocessor or other control circuit, as known to those skilled in the art. The DSP circuit 120 will determine, via an algorithm of the present invention, the frequency used to tune the synthesizer circuit, which will generate the signal to be heterodyned for the output of the multiple channel linear amplifier. This signal is an intermediate frequency (IF) and passes to a low pass filter (LPF) 124. The intermediate frequency (IF) is at a frequency used for known standards, such as the DOCOMO/UMTS frequency plan. The low pass filter 124 eliminates any harmonics and images.

From the low pass filter 124, the intermediate frequency signal passes into the sample and hold circuit 130. The signal is received within a bandpass filter (BPF) circuit 132 and will be a sharp filter, similar to a saw filter. The signal is then detected in a radio frequency detector 134, which could be any operable type known to those skilled in the art, but in the present example, is a log detector. The signal passes into a switch 136 and capacitor 138 that together act as a sample and hold circuit. A timer signal 140 is received from the DSP circuit 120 and drives the overall circuit. The timing is selected for best performance.

A stream of samples is received corresponding to a DC signal representing the segments or "chunks" of bandwidth. The DC signal will pass into the analog-to-digital converter 142 and to DSP circuit 120, where, in accordance with the algorithm of the present invention, processing occurs and decisions are based on the DC signal level. From the DSP circuit 120, the signal passes into a digital-to-analog conversion circuit 144 corresponding to DAC 56, and then to the multiple channel linear amplifier for phase shift and attenuation.

The circuit shown in FIG. 3 is operative based on the DOCOMO/UMTS frequency plan, where the RF frequency range is 2110 to 2170 MHz. This overall band is divided/designated into three sub-bands of 20 MHz each. Each sub-band can handle up to four carriers of 5 MHz each. The total carriers per overall band are twelve.

In summary of the operation, the synthesizer circuit 106 generates local oscillator (LO) frequencies, which are applied to the mixer circuit. A sampled MCLA output is applied to the RF side of the mixer circuit 108, as described before. The LO frequencies, in this example, are 2212.5 to 2267.5 MHz, 12 frequencies at 5 MHz increments, called f0, f1 ... f11. They are mixed with the sampled MCLA RF output. The mixing targets the centers of the 12 possible carriers, at 2112.5 to 2167.5 MHz, which are also spaced at 5 MHz apart. The result is a fixed IF frequency, fLO-fRF=100 MHz. The low pass filter will eliminate the fLO+fRF products.

The resulting IF signal passes through the band pass filter 132, which is centered at 100 MHz, having a passband of ~3 MHz. The filtered RF is applied to the log detector 134 and the sample and hold (S&H) circuit 136, as described before, where it is digitized by the analog-to-digital conversion circuit (quantization) 142. The algorithm presented in FIG. 10 will optimize and null the intermodulation distortion, as described below. As noted before, the algorithm is described and shown relative to the W-CDMA DOCOMO/UMTS frequency plan. There are 12 possible carriers available across the band.

Relative to FIG. 10, which will be described in detail later, the basic algorithm determines active sub-bands and based on those active sub-bands, the circuit determines where the intermodulation distortion settings will be placed. Although this depends on the sub-bands, this is an implementation specific circuit. Once the intermodulation distortion settings are set, the local oscillator frequency (LO) is set such that the intermodulation distortion settings are typically next to the active sub-bands. Then the intermodulation distortion is reduced based on those measurements at that point.

IS-95 PCS is also 60 MHz wide, but carrier-to-carrier spacing is 1.5 MHz, which yields a total of 48 possible carriers. In reality, only 46 are available, as two carriers are not valid because of bandwidth limitations at the band edges. IS 95 also has six designated sub-bands, three 15 MHz, and three 5 MHz each.

For IS-136, TDMA, the frequency plan is different. Carrier to carrier spacing is only 30 kHz, but a group of up to 15 carriers is used simultaneously per sector. This pattern yields a total band of 450 kHz per sector, or roughly 0.5 MHz. Any bandpass filter in the hardware circuit will be matched per application, as well as the number of frequency steps and perhaps some logic in the algorithm.

In one aspect of the present invention, as a non-limiting example, fRF=2112.5 to 2167.5 MHz, 12 carriers at 5 MHz BW each, divided into three sub-bands of 20 MHz with four carriers. (Overall RF range is 2110 to 2170 MHz.)

fLO=2212.5 to 2267.5 MHz, 12 frequencies at 5 MHz increments, called F0, f1 . . . f11.

fIF=100 MHz.

FIGS. 4-9 are bar charts illustrating the three sub-bands of 20 MHz each, where each sub-band handles up to four carriers of 5 MHz. The adjacent channel power (ACP) and alternate adjacent channel power (AACP) graph blocks are illustrated. FIG. 10 illustrates a flow chart for the basic algorithm used with the circuit shown in FIGS. 2 and 3.

Figure 4:
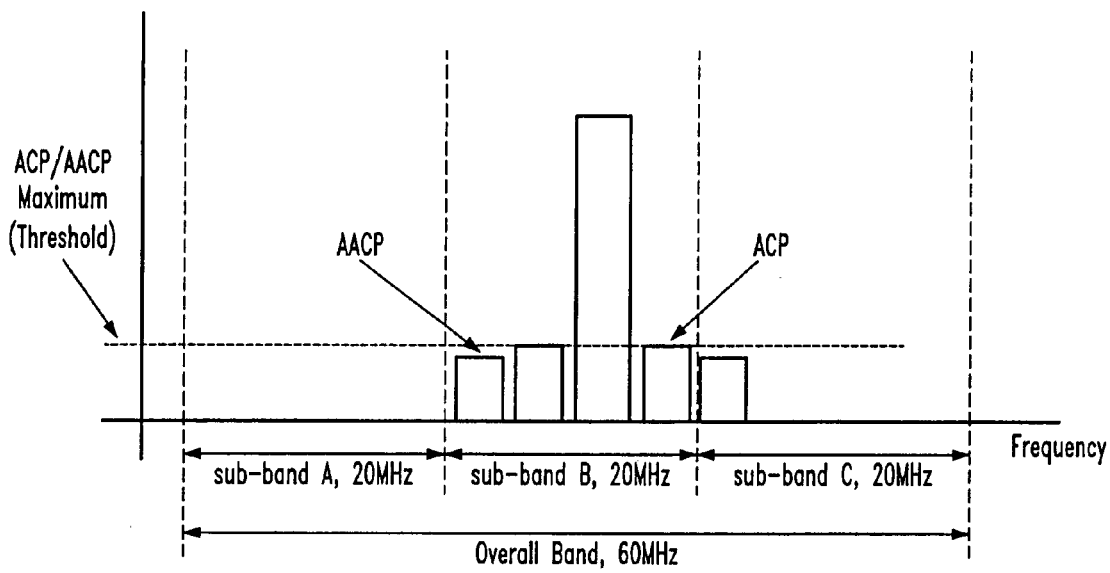
FIGS. 4-9 illustrate various sub-bands relative to the ACP/AACP thresholds for different carriers.

It is shown from the flow chart that an initial sweep is made of the various frequencies. As is described above in greater detail, the synthesizer is stepped up and there are 12 different frequencies. The data coming out of the channels will have a DC voltage that has been digitized to represent the signal strength of the power coming out of the respective channel. As shown in FIG. 4, the first signal carrier represents an actual carrier. Frequencies 5, 6, 8 and 9 are equivalent frequencies out of the twelve frequencies at issue. This represents the intermodulation product.

Figure 5:
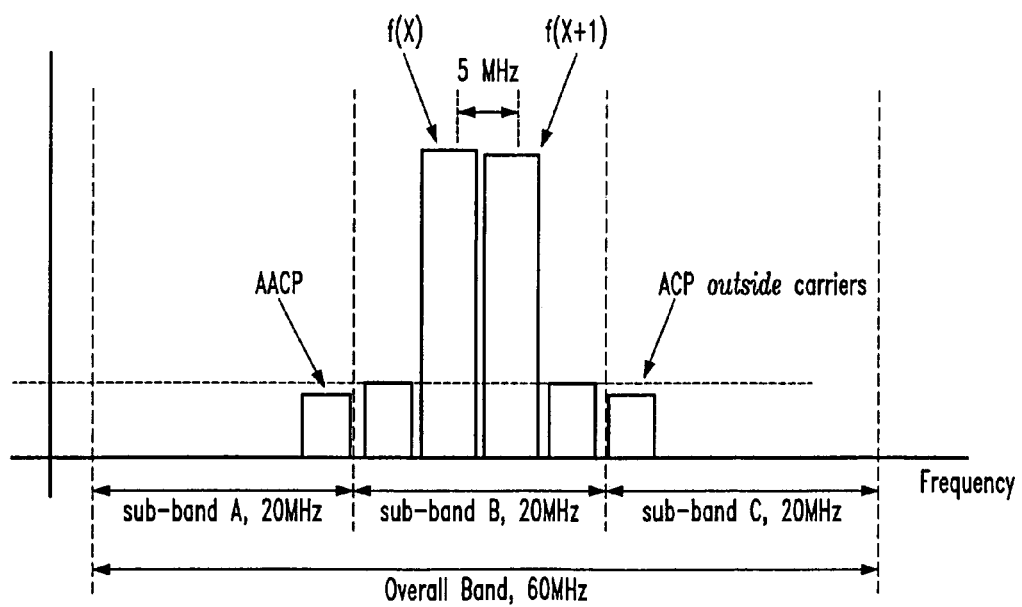
Figure 6:
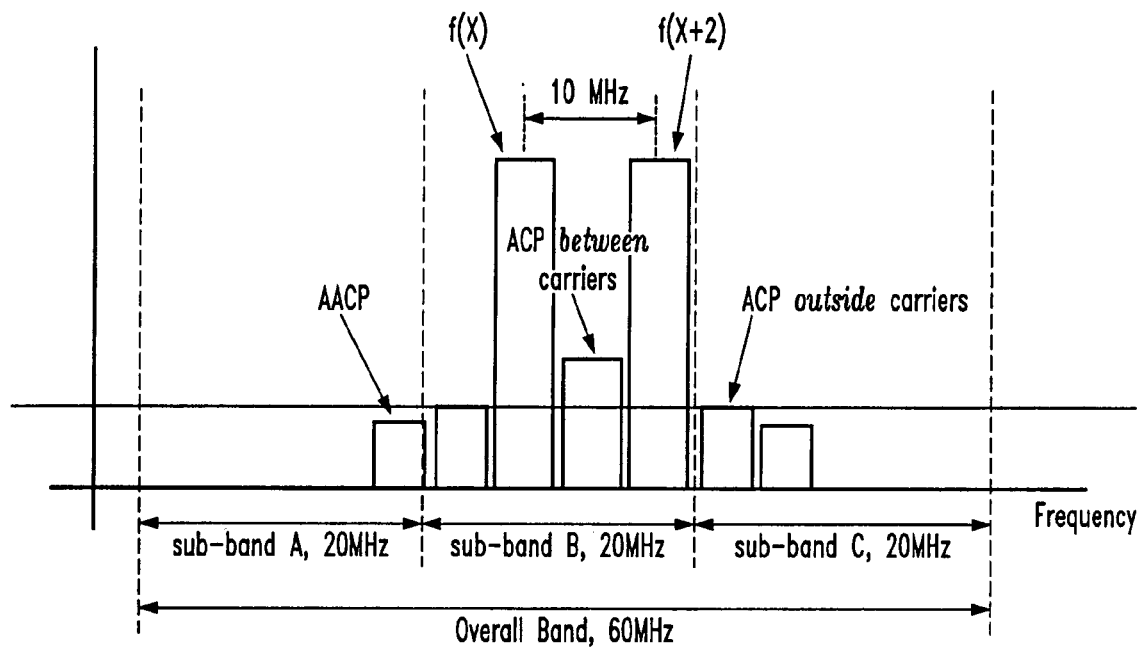
Figure 7:
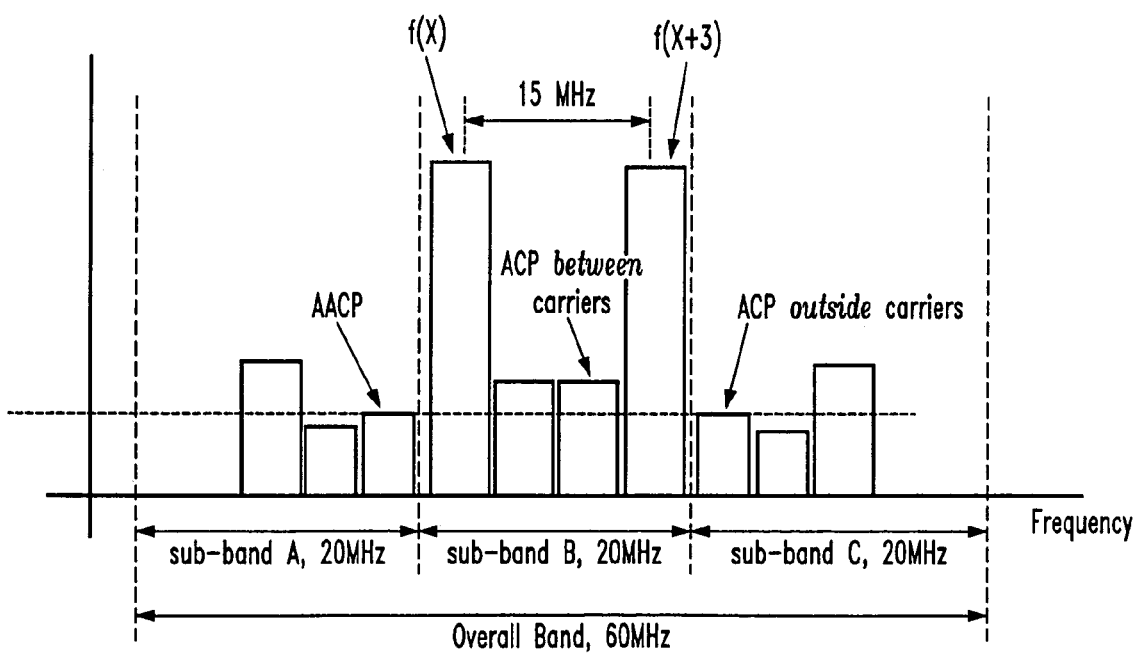

As shown in FIG. 5, the two frequency blocks are side-by-side. The spaced 5 MHz spectral signals are represented by frequencies 4, 5, 8 and 9. FIGS. 6 and 7 illustrate two carriers that are spaced 10 and 15 MHz apart respectively, but still within the single sub-band.

Figure 8:
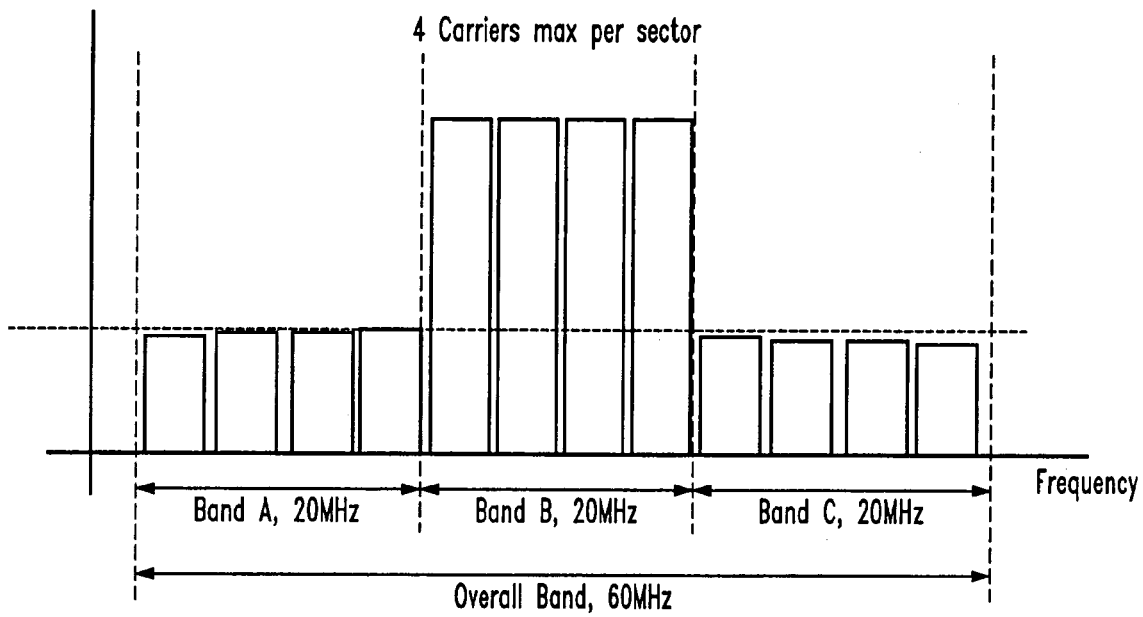
Figure 9:
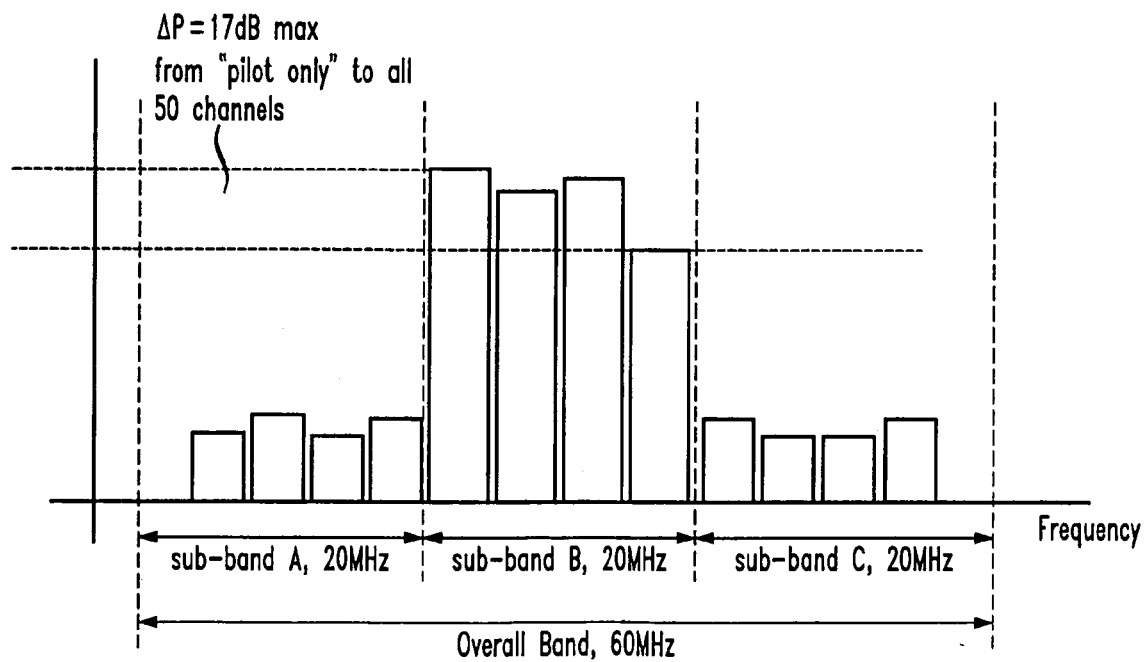

FIGS. 8 and 9 illustrate a worse case indication having four different levels with four carriers maximum per sector. FIG. 9 illustrates the 50 channels where the Delta P (ΔP) equals 17 dB max from "pilot only" to all 50 channels. If there is a working system and all carriers are "on", the maximum difference the system can expect from a fully loaded carrier to the pilot is about 17°. The numbers can change from system to system. It is evident from the description that the synthesizer circuit sweeps a scheme, and it is possible to download to the processor as many algorithms as desired.

Figure 10:
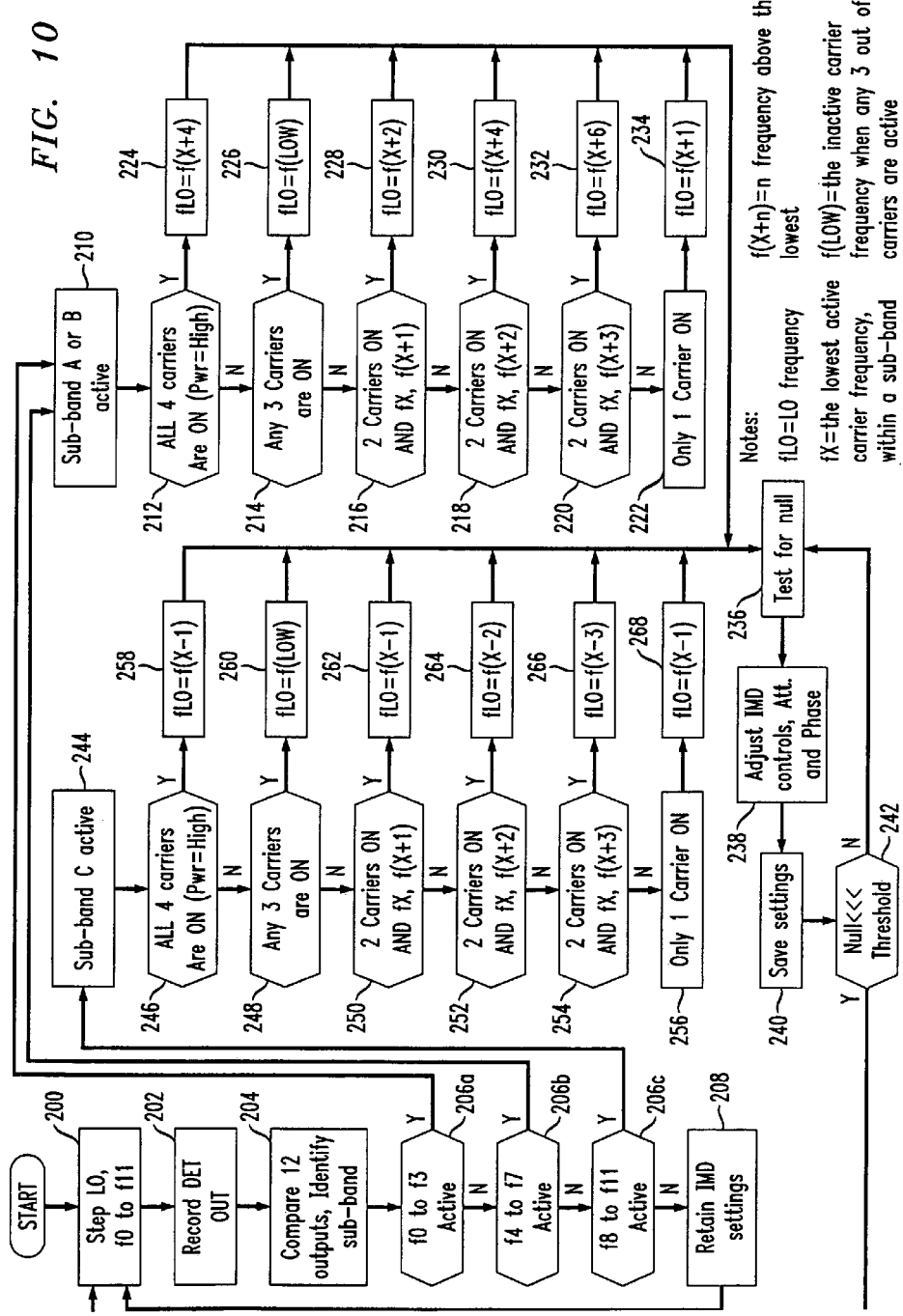
FIG. 10 is a high level flow chart illustrating an example of the algorithm that can be used for the intermodulation distortion nulling circuit of the present invention shown in FIG. 2.

FIG. 10 illustrates a flow chart for the algorithm that is applicable for use with the circuits shown in FIGS. 2 and 3.

As noted before, the algorithm as shown in FIG. 10 determines active sub-bands and based on those active sub-bands determines where the intermodulation distortion setting will be placed. After this, the local oscillator is set such that the intermodulation distortion setting would be next to the active sub-bands. The intermodulation distortion is then reduced based on the measurements at that point. Thus, based on the active sub-bands, the local oscillator is set to the intermodulation distortion. Based on these active sub-bands, it is possible to know where the intermodulation distortion is located and the IMD can be detected and cancelled.

For example, in the flow chart, which will be described in greater detail later, at block 204, the twelve outputs are compared and the system scans the twelve increments. Each one is looked at based on a threshold (such as if it is above a certain decibel level). If it is above that threshold, then it is an active sub-band and a determination is made as in 206a, 206b, 206c, whether certain sub-bands are active. If not active, then the IMD settings are retained, as at block 208. Throughout this description, F(Lo) equals the local oscillator frequency and F(x) equals the lowest active carrier frequency within a sub-band. F(X+N) equals N frequency above the lowest, while F(low) equals the inactive carrier frequency when any three out of four carriers are active.

For example, if F0 to F3 is active, such as at decision block 206a, then the system determines which of all four are on. If all four carriers are on, then for example, the local oscillator frequency is set to F(X+4). The different settings for different examples are shown in the figures shown in FIGS. 4-9, if the four carriers are on and F(X+4) is not an active sub-band, but next to it is the intermodulation distortion and that will be reduced. Thus, the sub-bands are identified at any increment, which is above a certain threshold. That is considered an active sub-band after the process is followed through as in the flow chart of FIG. 10.

Depending on those active sub-bands, the circuit determines via the algorithm how to set the local oscillator to the IMD desired. For example, if all four sub-bands are "on," the system determines that it is at the high end of the spectrum. If the system goes higher, it is out of band. Thus, it is necessary to set the IMD to F(X−1), i.e., the next lowest increment below the band where the highest IMD will be located. If any three carriers are on, then the system moves to the inactive carrier frequency out of the group of four and to the one that is inactive where the IMD will be located. For example, F(X), F(X+1) can be the two lowest carriers, and thus, the local oscillator is set to F(X−1). The IMD will be located adjacent to it. This is shown in FIGS. 4, 5, 6 and 7. Thus, depending on the active sub-band, the system places the local oscillator at the spot and that is where the IMD will be at. There are, of course, different combinations as set forth in FIGS. 4-10. It is desirable not to go into another carrier's band.

The process starts and the circuit steps the LO from F0 to F11, as indicated at block 200. The detector output is recorded, corresponding to the DC signal coming out (block 202) and the 12 outputs are compared to identify the sub-band (block 204). This occurs by determining sub-band A, sub-band B or sub-band C and determining which frequencies, such as F0 to F3, are active in blocks 206a, 206b and 206c, through appropriate decision making. If none of the frequencies are active, then the intermodulation distortion settings are retained (block 208). This initial sweep identifies a sub-band. It is not possible to sweep the sub-band only to determine additional frequencies out-of-band, where one would expect the adjacent channel power (ACP) to be high enough and detectable. Once it is determined that a sub-band is active, decisions are made as to the carriers that are active. It is not necessary to step once again because it is loaded in memory and a threshold is set.

For example, if sub-band A or B is active (block 210), then decisions are made to check whether all four carriers are on (power equals high) (block 212), any three carriers are on (block 214), any two carriers are on and the spacing (blocks 216, 218 and 220), or whether one carrier is on (block 222). If yes, then the results are shown at blocks 224, 226, 228, 230, 232 and 234. The system tests for null (block 236) and adjusts the respective intermodulation distortion controls, the attenuation and phase circuits (block 238). The settings are saved (block 240), and if the null is less than the threshold (block 242), then the stepping procedure begins once again (block 200).

If sub-band C is active (Block 244), corresponding to frequencies F8 to F11, then a determination is made whether all four carriers are on (block 246), any three carriers are on (block 248), any two carriers are on with different separation (blocks 250, 252 or 254), or only one carrier is on (block 256). If yes, then the local oscillator frequency is adjusted as indicated at blocks 258, 260, 262, 264, 266 or 268 respectively. Then the test is made for null at block 236.

It is evident from this flowchart that the digital signal processor circuit will set the control voltage and start searching. It will adjust the attenuation and phase shift until minimization occurs and there is a null. In this description, F(x) and F(x+1) corresponds to adjacent carriers while F(x+3) corresponds to 15 MHz separation.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of reducing intermodulation distortion within a linear amplifier comprising the steps of:
    sampling the output of a multiple carrier linear amplifier radio frequency signal;
    detecting the sampled signal at frequency increments and quantizing and nulling the intermodulation distortion; and
    determining active sub-bands by scanning a plurality of carriers corresponding to frequency increments above a threshold, and establishing the carrier as an active sub-band.

2. A method according to claim 1, and further comprising the steps of generating a local oscillator signal having predetermined frequency increments $f_o \ldots f_i$ situated in at least one of the sub-bands.

3. A method according to claim 2, and further comprising the steps of mixing the sampled radio frequency signal with the local oscillator signal to target the centers of the multiple carriers and generate an intermediate frequency signal.

4. A method according to claim 3, and further comprising the step of filtering the resultant intermediate frequency signal before detecting and digitizing the quantization.

5. A method according to claim 4, and further comprising the step of stepping local oscillator frequency increments $f_o$ to $f_i$, and comparing the outputs of the steeping operation to identify sub-bands.

6. A method according to claim 5, and further comprising the step of determining which frequencies are active in which sub-bands and adjusting the local oscillator frequency based on the determined active frequencies.

7. A method of reducing intermodulation distortion within a linear amplifier comprising the steps of:
    sampling the output of a multiple carrier linear amplifier radio frequency signal;
    generating a local oscillator signal having predetermined frequency increments $f_o \ldots f_i$ situated in at least one of predetermined sub-bands;
    mixing the sampled radio frequency signal with the local oscillator signal to target the centers of the multiple carriers and generate an intermediate frequency signal;
    detecting and digitizing the intermediate frequency signal for quantization and nulling of the intermodulation distortion; and
    stepping local oscillator frequency increments $f_o$ to $f_i$, and comparing the outputs of the stepping operation to indentify sub-bands.

8. A method according to claim 7, and further comprising the step of filtering the resultant intermediate frequency signal before detecting and digitizing for quantization.

9. A method according to claim 7, and further comprising the step of determining which frequencies are active in which sub-bands and adjusting the local oscillator frequency based on the determined active frequencies.

10. A method according to claim 7, and further comprising the step of generating frequency increments $f_o \ldots f_{ii}$ in 5 MHz increments.

11. A method according to claim 7, and further comprising the step of generating the radio frequency signal in a radio frequency range from about 2110 to about 2170 MHz.

12. A method according to claim 7, and further comprising the step of dividing the radio frequency signal into three sub-bands having up to four carriers.

13. A method according to claim 7, and further comprising the step of detecting the intermediate frequency signal within a sample and hold circuit having a detector operative therewith.

14. A method of reducing intermodulation distortion within a linear amplifier comprising the steps of:
    sampling the output of a multiple carrier linear amplifier radio frequency signal;
    generating a local oscillator signal having predetermined frequency increments $f_o \ldots f_i$ situated in at least one of predetermined sub-bands;
    mixing the sampled radio frequency signal with the local oscillator signal for targeting the centers of the multiple carriers and generating an intermediate frequency signal, said step of mixing further comprising the steps of stepping local oscillator frequency increments $f_o$ to $f_i$, comparing the outputs of the stepping operation to identify sub-bands, determining which sub-bands are active, and adjusting local oscillator frequency based on the determined active frequencies.

15. A method according to claim 14, and further comprising the step of detecting and digitizing the intermediate frequency signal for quantization and nulling of the intermodulation distortion.

16. A method according to claim 15, and further comprising the step of filtering the resultant intermediate frequency signal before detecting and digitizing the quantization.

17. A method according to claim 14, and further comprising the step of generating frequency increments $f_o \ldots f_i$ in 5 MHz increments.

18. A method according to claim 14, and further comprising the step of generating the radio frequency signal in a radio frequency range from about 2110 to about 2170 MHz.

19. A method according to claim 14, and further comprising the step of dividing the radio frequency signal into three sub-bands, each sub-band having up to four carriers.

20. A method according to claim 14, and further comprising the step of detecting the intermediate frequency signal within a sample and hold circuit having a detector operative therewith.

21. A multiple carrier linear amplifier circuit having reduced intermodulation distortion comprising:

balanced amplifier circuits for processing a multiple carrier linear amplifier radio frequency signal;

an intermodulation distortion identification and quantization circuit connected to said balanced amplifier circuits for receiving a sampled radio frequency signal;

a detector circuit for detecting the sampled frequency signal for quantization and nulling the intermodulation distortion, said detector circuit comprising a sample and hold circuit; and a synthesizer circuit for generating a local oscillator signal having predetermined frequency increments $f_o \ldots f_i$ situated within one of predetermined sub-bands and a mixer for mixing the sampled radio frequency signal with the local oscillator signal and targeting the centers of multiple carriers.

22. A method of reducing intermodulation distortion within a linear amplifier comprising the steps of:

sampling the output of a multiple carrier linear amplifier radio frequency signal;

generating a local oscillator signal having predetermined frequency increments $f_o \ldots f_i$ situated in at least one of predetermined sub-bands;

mixing the sampled radio frequency signal with the local oscillator signal to target the centers of the multiple carriers and generate an intermediate frequency signal;

detecting and digitizing the intermediate frequency signal for quantization and nulling of the intermodulation distortion; and dividing the radio frequency signal into three sub-bands having up to four carriers.

* * * * *